US008416546B2

(12) United States Patent
Arndt et al.

(10) Patent No.: US 8,416,546 B2
(45) Date of Patent: Apr. 9, 2013

(54) METHOD AND CIRCUIT ARRANGEMENT FOR DETECTING THE STATE OF A LOAD DEVICE WHICH CAN BE CONNECTED TO A SWITCHING CONNECTION (75) Inventors: Bastian Arndt, Regensburg (DE); Ralf Förster, Regensburg (DE); Marco Well, Regensburg (DE); Gunther Wolfarth, Regensburg-Harting (DE)

(73) Assignee: Continental Automotive GmbH, Hannover (DE)

( * ) Notice: Subject to any disclaimer, the term of this patent is extended or adjusted under 35 U.S.C. 154(b) by 0 days.

(21) Appl. No.: 12/440,928

(22) PCT Filed: May 31, 2007

(86) PCT No.: PCT/EP2007/055330
§ 371 (c)(1),
(2), (4) Date: Mar. 12, 2009

(87) PCT Pub. No.: WO2008/037510
PCT Pub. Date: Apr. 3, 2008

(65) Prior Publication Data
US 2009/0309607 A1    Dec. 17, 2009

(30) Foreign Application Priority Data
Sep. 26, 2006    (DE) .......................... 10 2006 045 308

(51) Int. Cl.
H02H 3/00    (2006.01)
H02H 3/08    (2006.01)
H02H 9/02    (2006.01)

(52) U.S. Cl. ........................................ 361/86; 361/93.1

(58) Field of Classification Search .................... 361/86, 361/93.1
See application file for complete search history.

(56) References Cited

U.S. PATENT DOCUMENTS
5,138,516 A * 8/1992 Chapman ........................ 361/18
6,486,726 B1 * 11/2002 Worley et al. ................. 327/514
(Continued)

FOREIGN PATENT DOCUMENTS
DE    102005004608 B3    4/2006
EP    1465313 A1    10/2004
(Continued)

OTHER PUBLICATIONS
German Office Action dated Jun. 26, 2007.
(Continued)

Primary Examiner — Rexford Barnie
Assistant Examiner — Christopher Clark
(74) Attorney, Agent, or Firm — Laurence A. Greenberg; Werner H. Stemer; Ralph E. Locher (57) ABSTRACT A method for detecting the state of a load device which can be connected to a switching connection, wherein the switching connection can be coupled to, and decoupled from, a predefined switching potential. A voltage drop across the switching connection is used as a basis for detecting whether the load device is connected to the switching connection, the load device is not connected to the switching connection or there is a short circuit between the switching connection and a first or a second switching potential. An additional current source is connected to the switching connection at the same time as the switching connection is decoupled from the predefined switching potential.

17 Claims, 6 Drawing Sheets

U.S. PATENT DOCUMENTS

| | | | |
|---|---|---|---|
| 7,280,333 B2 | 10/2007 | Horsky et al. | |
| 7,667,940 B2 * | 2/2010 | Turpin et al. | 361/93.1 |
| 2004/0257735 A1 | 12/2004 | Horsky et al. | |
| 2005/0195003 A1 * | 9/2005 | Soe | 327/157 |
| 2006/0055380 A1 | 3/2006 | Galvano et al. | |
| 2006/0082376 A1 | 4/2006 | Allen et al. | |
| 2008/0150539 A1 | 6/2008 | Arndt et al. | |
| 2008/0259515 A1 | 10/2008 | Turpin et al. | |

FOREIGN PATENT DOCUMENTS

| | | |
|---|---|---|
| EP | 1519465 A1 | 3/2005 |
| WO | 2006056232 A1 | 6/2006 |

OTHER PUBLICATIONS

International Search Report dated Oct. 4, 2007.

* cited by examiner

METHOD AND CIRCUIT ARRANGEMENT FOR DETECTING THE STATE OF A LOAD DEVICE WHICH CAN BE CONNECTED TO A SWITCHING CONNECTION

BACKGROUND OF THE INVENTION

Field of the Invention

The present invention relates to a method and a circuit arrangement with which the state of loads can be diagnosed, in particular those connected to low-side or high-side switches.

Integrated power switches are often configured as so-called low-side switches, whereby a switching connection can be connected to a specified low potential, usually by means of a power transistor. This serves to actuate a load that is connected to the switching connection, for example a switch relay, which has to switch particularly high currents or voltages. For example, a low-side switch connects a load that is connected to an operating voltage potential to earth. With high-side switches, the switching connection in question can be set to a specified high potential by means of a switch transistor in order to actuate the relevant load. For example, a high-side switch can connect a load that is connected to earth to the operating voltage potential. In order to ensure the electromagnetic compatibility (EMC) of such a circuit arrangement, a buffer capacitor must generally be connected to the switching connection. Power switches of this type are used in particular in the automotive field.

As well as the actuation of a load by the relevant specified logical level at the switching connection, it is also desirable to detect possible error states of the load itself. For example, it is possible that, with an open-load state, the electrical connection between the load, for example the switching connection of the relay and the switching connection of the power switch, is interrupted. Furthermore, it is conceivable that there is a short circuit of the switching connection, for example to earth or to the battery supply voltage, for the load in question.

In order to detect these possible faults, methods are known in which a reference potential is applied across the switching connection when the relevant switch transistor is off and the voltage curve over time is measured. Using the voltage curve, which essentially depends on the charge or discharge state of the buffer capacitor, an open-load situation can be inferred for example. The problem with this type of diagnosis is particularly the unfavorably long time lapse caused by the recharging of the capacitor during a corresponding diagnosis time, as a reliable diagnosis for the load is not possible until this process is complete. The diagnosis time is also known as the filter time.

BRIEF SUMMARY OF THE INVENTION

An object of the present invention is therefore to specify a method for detecting the state of a load that is connected to a switching connection in which the filter time is as low as possible.

This object is achieved by means of a method for detecting the state of a load device that can be connected to a switching connection as claimed in claim 1. Furthermore, this object is achieved with circuit arrangements with the features of claims 10 and 11.

Accordingly, a method for detecting the state of a load device that can be connected to a switching connection is provided, wherein the switching connection can be coupled to and decoupled from a predetermined switching potential. In the method, a voltage drop across the switching connection is used as a basis for detecting whether the load device is connected to the switching connection, the load device is not connected to the switching connection, or there is a short circuit between the switching connection and a first or a second switching potential. An additional current source is connected to the switching connection at the same time as the switching connection is decoupled from the predefined switching potential.

Preferably, a capacitor is provided between the switching connection and the first switching potential and is used to determine the voltage drop.

According to the present invention, an additional current source is connected briefly, which for example assists and accelerates the respective charging or discharging of a capacitor that is connected to the switching connection. In this way, the switching connection quickly achieves a known diagnosis potential for example in an open-load situation.

The additional current source is preferably connected to the switching connection for a predetermined filter time period. In a particularly preferred variant of the method, the additional power source is removed from the switching connection if a measurement potential measured at the switching connection corresponds to a diagnosis potential. The diagnosis potential can be selected such that, for example in the case of an open-load situation, the diagnosis potential must be passed through by the measurement potential in order to establish an equilibrium potential or to ensure a charge equalization of the charge stored in the capacitor.

The method preferably exhibits the following procedural steps:

Decoupling of the load device from the switching connection;

Application of a reference potential across the switching connection;

and

Connection of an additional current source between an adjustment potential and the switching connection until a measurement potential across the switching connection corresponds to the diagnosis potential or until a predetermined filter time has expired, in particular for charging or discharging the capacitor.

For example, the measurement potential across the switching connection is tapped and compared to the diagnosis potential. If the predetermined filter time period is preferably selected such that the switching connection can be brought to the reference potential by means of charging or discharging the capacitor within the filter time period using the applied reference potential and the additional current source, a particularly high diagnosis or switching frequency is provided for a corresponding switching device because a particularly rapid charging or discharging of the capacitor is possible due to the connection of the additional current source. The appropriate diagnosis potential can be selected such that it is reached by the measured potential at a point in time before the reference potential.

In a variant of the method, the load device is arranged as a predefined switching potential between the switching connection and an earth potential, and the switching connection can be coupled to a battery potential by means of a controllable switch. Once the load device has been decoupled from the battery potential, the fact that the load device is not connected to the switching connection and/or to the earth potential is detected if the measurement potential is in a predetermined open-load-potential range within the filter time period. With this method variant, which is specific to a high-side switch, the capacitor is quickly discharged, in particular by means of the additional current source, if there is an open-load situation, meaning that the reference potential would have to occur at the switching connection. The diagnosis potential is then preferably above the reference potential. The open-load-potential range can then be defined as a voltage between an upper and a lower diagnosis potential.

In a further variant of the method, the load device is arranged as a predefined switching potential between the switching connection and a battery potential, and the switching connection can be coupled to an earth potential by means of a controllable switch. Once the load device has been decoupled from the earth potential, the fact that the load device is not connected to the switching connection and/or the battery potential is detected if the measurement potential is in a predetermined open-load-potential range within the filter time period.

In this method variant, which is specific to a low-side switch, the capacitor is quickly charged, in particular by means of the additional current source, so that the reference potential would have to occur at the switching connection. The diagnosis potential is then preferably less than the reference potential. As soon as the diagnosis potential is reached, the additional current source is switched off and a diagnosis result prepared.

A circuit arrangement for detecting the state of a load device that can be connected between a switching connection and a first switching potential comprises:
  a controllable switch that is connected between the switching connection and a second switching potential; and
  a first current source that is connected between a first adjustment potential and the switching connection, and a second current source that is connected between the switching connection and a second adjustment potential, whereby a reference potential can be tapped at the switching connection between the first and the second current source; and
  an additional current source that can be connected between the first adjustment potential and the switching connection.

This circuit arrangement forms a high-side switch with a rapid diagnosis capability regarding the charge state for example.

A further embodiment provides a circuit arrangement for detecting the state of a load device that can be connected to a switching connection, comprising:
  a controllable switch that is connected between the switching connection and a first switching potential;
  a first current source that is connected between a first adjustment potential and the switching connection, and a second current source that is connected between the switching connection and a second adjustment potential VP, whereby a reference potential can be tapped at the switching connection between the first and the second current source; and
  an additional current source that can be connected between the second adjustment potential and the switching connection.

The load device can be connected between the switching connection and a second switching potential.

This embodiment is particularly suitable for a low-side switch that also allows a short filter time and therefore a high switching frequency. The relevant controllable switch is preferably configured as a MOSFET, in particular as a p-or n-channel MOSFET. Furthermore, the first and second current source and/or the additional current source are preferably configured as connectable controllable current sources. Furthermore, a capacitor is preferably provided that is connected between the switching connection and the first switching potential.

In a particularly advantageous embodiment, a control device is coupled to the switching connection and is configured such that a method according to the present invention can be executed in order to detect the state of a load device that can be connected to the switching connection.

The control device advantageously exhibits a comparator for comparing the measurement potential with the diagnosis potential.

In an advantageous embodiment, the circuit arrangement is configured as an integrated high-side switch or low-side switch, whereby the controllable switch, the first and second current source, the additional current source and the control device are configured such that they are integrated on a chip.

Further advantageous embodiments of the invention are the subject of the subclaims and of the exemplary embodiments described below.

BRIEF DESCRIPTION OF THE SEVERAL VIEWS OF THE DRAWING

The invention is described in more detail below with reference to preferred embodiments and with reference to the figures, in which.

DESCRIPTION OF THE INVENTION

Unless otherwise specified, elements that are identical or that have identical functions have the same reference numerals in the figures.

Figure 1:
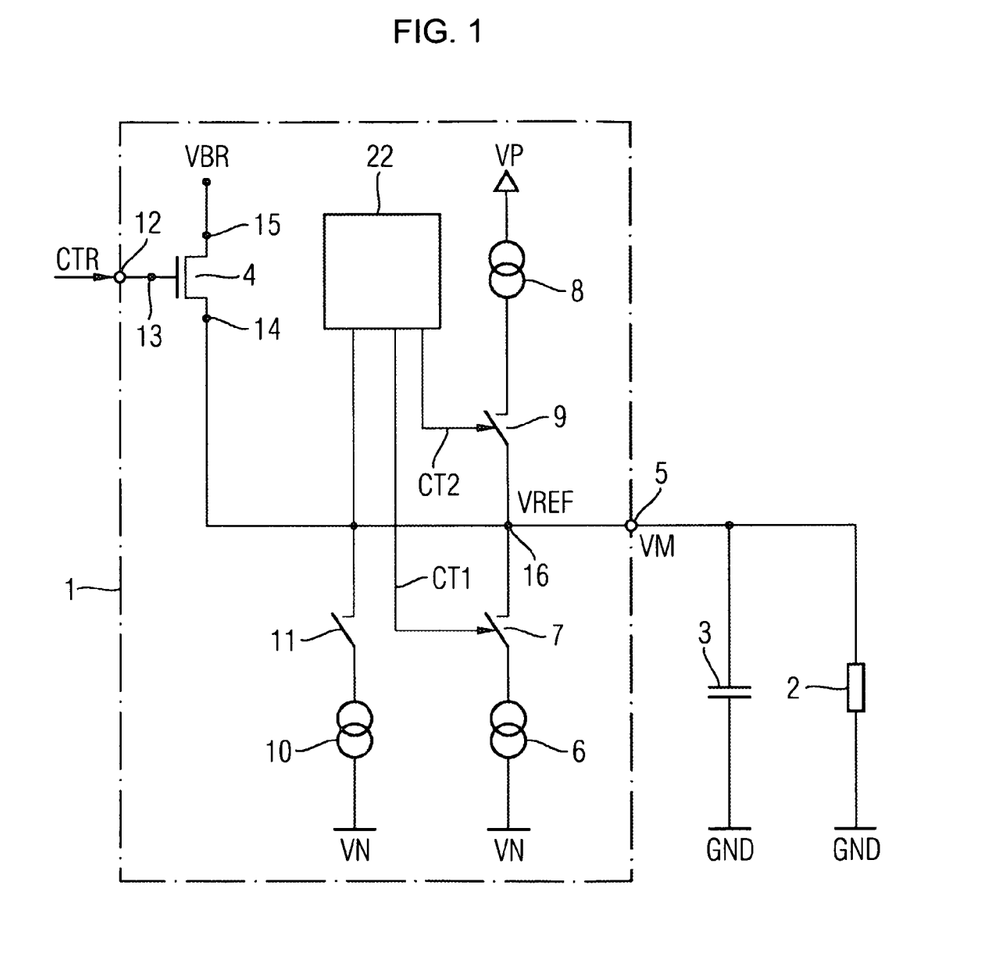
FIG. 1 shows a first embodiment of the circuit arrangement according to the present invention.

FIG. 1 shows a first embodiment of a circuit arrangement for detecting the state of a load device that can be connected to a switching connection as a high-side switch. The circuit arrangement 1 exhibits a control input 12 and a switching connection 5. A load device 2 can be connected to the switching connection 5, and is connected for example between the switching connection 5 and a first switching potential, which is configured as an earth potential GND here. Furthermore, a buffer capacitor 3 is connected between the switching connection 5 and the earth potential which buffers voltage peaks and thus ensures the electromagnetic compatibility of the high-side switch.

A controllable switch 4 is configured as a power MOSFET transistor which exhibits a control or gate terminal 13 and a controllable channel between a source terminal 14 and a drain terminal 15. The drain terminal 15 is connected to a second switching potential VBR which, for example, exhibits a battery potential VBR of 12 volts derived from a battery voltage from a car battery. The source terminal 14 is connected to the switching connection 5. By means of the control input 12 of the high-side switch 1, a logical control signal CTR can be coupled to the gate terminal 13, whereby the switch transistor 4 either opens or closes the controllable channel and thus triggers a connection of the switching connection 5 to the battery potential VBR or brings about a disconnection at the controllable connection 13 at a low logic level. The load device 2 can thus be connected between the earth potential GND and the battery potential.

A first and a second current source 6, 8 are configured in order for a reference potential VREF to be provided at a node 16. The first current source 6 is connected between the node 16 and a first adjustment potential VN by means of a controllable switch 7. The second current source 8 can be connected between the node 16 and a second adjustment potential VP by means of a controllable switch 9. The switches 7, 9 are controlled by a control device 22 in such a way that a constant reference potential is present at the node 16. For this purpose, the control device 22 is coupled to the node 16 and transmits control signals CT1, CT2 to the switches 7, 9. Typically, the first adjustment potential VN is set to 0 volts, i.e. earth, and the second adjustment potential VP is at a logical level of 5 volts. If the first and second current sources 6, 8 are equally rated at usually about 0.1 mA, a reference potential of 2.5 volts results at the node 16 and the switching connection 5 if the current sources 6, 8 are switched on. Furthermore, there is an additional current source 10 that can be connected between the first adjustment potential VN and the switching connection 5 by means of a switch 11. This additional current source 10 has a rating of 20 mA in an exemplary embodiment.

Figure 2:
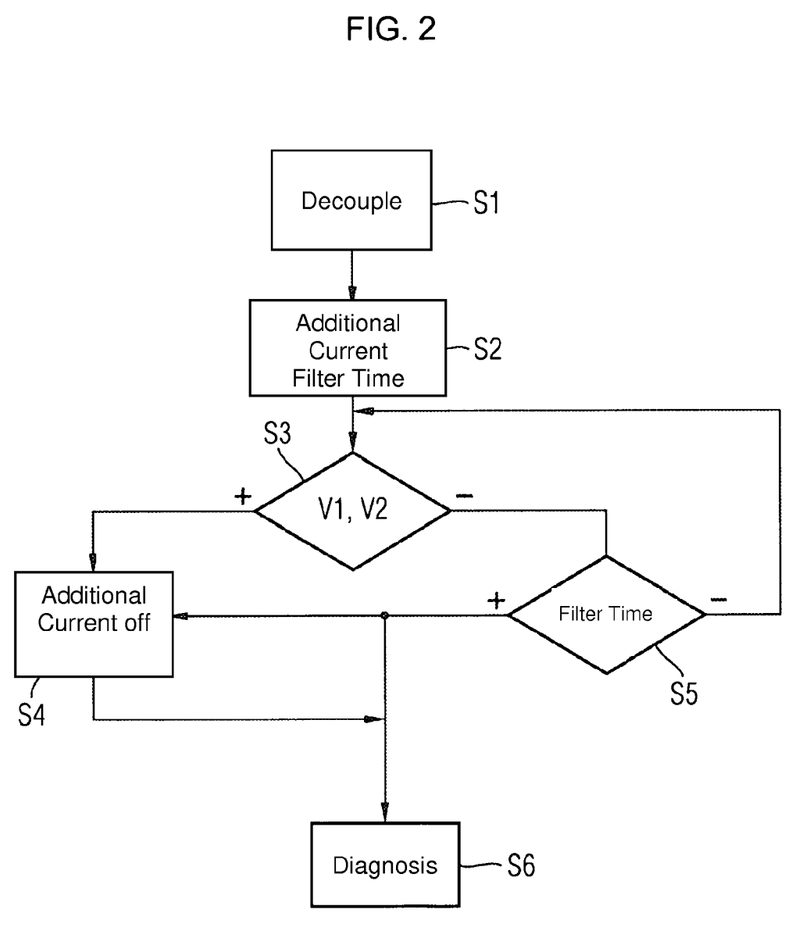
FIG. 2 shows a variant of the method according to the present invention.

In order to diagnose whether the load device 2 is reliably electrically connected to the switch terminal 4 and the earth potential GND, the process steps shown in FIG. 2 are essentially executed.

In order for a diagnosis to be carried out, the transistor 4 is switched off in a first step S1 by means of the control signal CTR, i.e. the switching connection 5 is decoupled from the battery potential VBR. At the same time as the switching off of the transistor 4, the switch 11 is closed in step S2, so that the capacitor 3 can be discharged by means of the additional current source 10 if the load 2 has been disconnected from the switching connection 5. This may occur for example if there is a loose wire in the engine or wiring harness of a motor vehicle.

Furthermore, the filter time T is started, which determines the time period for the diagnosis. T is selected such that the potential V2 can occur at the switching connection 5 within this filter time T in the event of an open-load situation with the additional current source 10 connected.

In step S3, the potential present at the switching connection 5 is measured as the measurement potential VM and checked to establish whether this lies within the open-load-potential range V2-V1. V2 can be 3 volts and V1 2 volts for example. The result of the comparison or the curve of the measurement potential VM over time can be used to determine whether an open-load fault is present, i.e. the load device 2 is not connected to the switching connection 5. If the diagnosis potential V2 is reached, the additional current source 10 is switched off in step S4. In this case, the load 2 cannot be connected. However, if VM does not lie within V2-V1, it is checked in step S5 whether the filter time period T has expired. If this is not the case step S5 is repeated. If it is determined that the filter time has expired and the measurement potential has not reached the diagnosis potential V2, it can be concluded that there is no fault with the load device. At the same time as the filter time T expires the additional current source is switched off in step S4. In the final step S6, an appropriate diagnosis result is issued. If, however, step S4 was initiated, an open-load fault is diagnosed in step S6.

Figure 3:
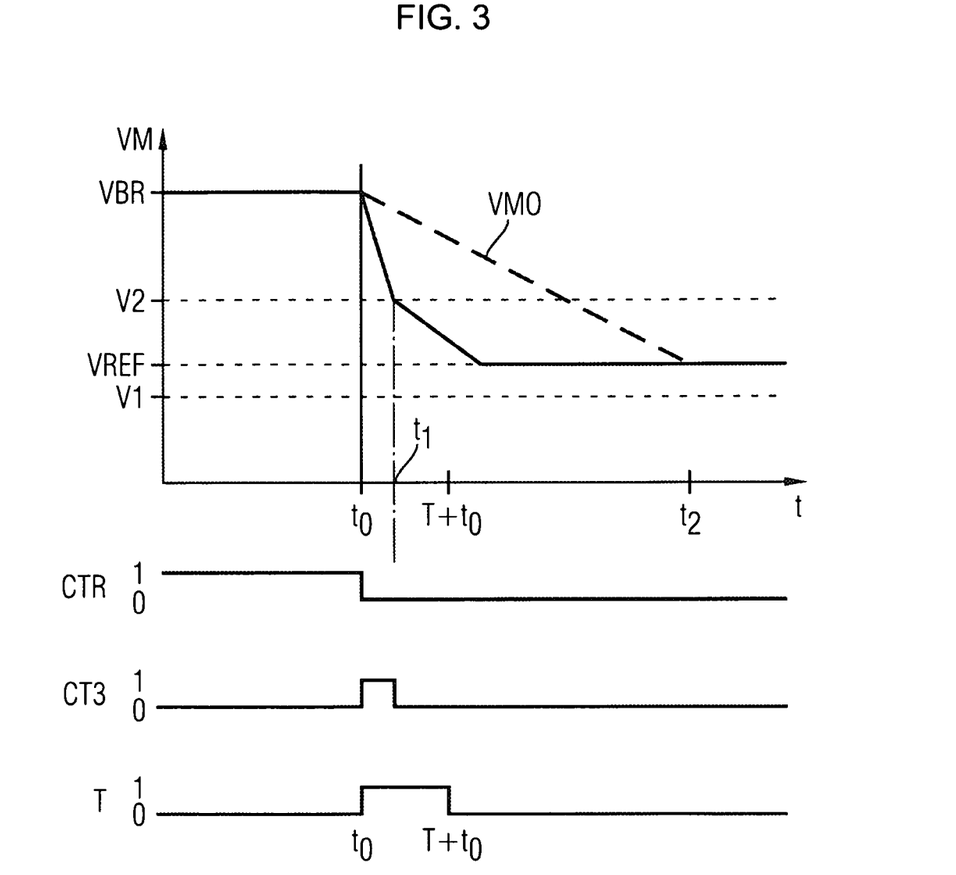
FIG. 3 shows voltage curves for the first embodiment of the circuit arrangement.

FIG. 3 shows schematically possible voltage curves of the measurement potential as VM and the chronological sequence of the connecting of the additional current source and the filter time T. At times $t<t_0$, it is assumed that the switch transistor 4 is connecting the switching connection VM and the coupled load device 2 to the battery potential VBR. In order to carry out the diagnosis, i.e. to determine whether the load device 2 is reliably connected to the switching connection, the transistor 4 is switched off at time $t_0$, i.e. the switching connection 5 is decoupled from the battery potential VBR. This is controlled by means of the control signal CTR. At the same time, the reference potential VREF provided by the current sources 6, 8 is applied to the node 16. If the load device 2 is not connected to the switching connection 5 due to a malfunction, the capacitor 3 must first be discharged until the reference potential VREF of 2.5 volts is present at the switching connection 5.

The dashed line VM0 shows the progression of the measured voltage VM0 without an additional current source. In this case, the capacitor 3 will only discharge slowly by means of current source 6, so that the reference potential VREF is not achieved and an open-load fault cannot be detected until time $t_2$. According to the present invention, however, the additional current source 10 is connected by means of switch 11 at the same time as the decoupling, as indicated by the curve for the control signal CT3 (see FIG. 6). This means that the capacitor 3 can also be considerably more quickly discharged by means of the additional current source in the event of an open-load state, so that VM approaches the reference potential VREF at the switching connection 5 and reaches the diagnosis potential V2 after a significantly shorter period of time $t_1$. This is indicted in FIG. 3 by the solid line. In this way, the additional current source 10 can be switched off again after $t_1$, and the fault diagnosis can be issued on expiry of the filter time T.

A filter time T is set such that, on expiry of the filter time T, the capacitor 3, which has a capacitance of 6.8 nF for example, is reliably discharged when all three current sources 6, 8, 10 are switched on so that the open-load-potential range of between V2 and V1 is reached. This means that it can be determined at time $t_0+T$, which is considerably sooner than $t_2$, whether an open-load situation is present.

In the event that there is no fault present, i.e. the load device 3 is connected to the switching connection 5 as intended, the earth potential GND occurs at the switching connection at practically the same time as the decoupling of the switching connection 5 from the battery potential VBR at the time $t_0$, as the capacitor 3 is immediately discharged by the load. If voltages of less than V1 are measured after the decoupling, it can therefore be concluded that there is no fault.

If, on the contrary, there is a short circuit of the switching connection 5 to the battery potential VBR, the potential at the switching connection 5 will not be less than V2 at time $t_1$ even after the expiry of the filter time T, meaning that this fault situation can also be detected.

The considerably reduced discharging time of the capacitor 3 due to the connection of the additional current source 10 enables a significantly increased switching frequency, as the battery potential can be coupled again by switch 1 as early as time $t_1$ by means of actuating the gate terminal 13 of the transistor 4. By connecting the additional current source 10 only during the diagnosis or detection of a fault that may or may not be present, there is also no risk of leakage currents. A potential open-load state of load device 2 is detected when switching connection 5 is statically switched off, i.e. decoupled. However, because the charging or discharging current is only increased briefly, there is no risk that the load device 2 will be powered by the current supplied by the additional current source 10.

Figure 4:
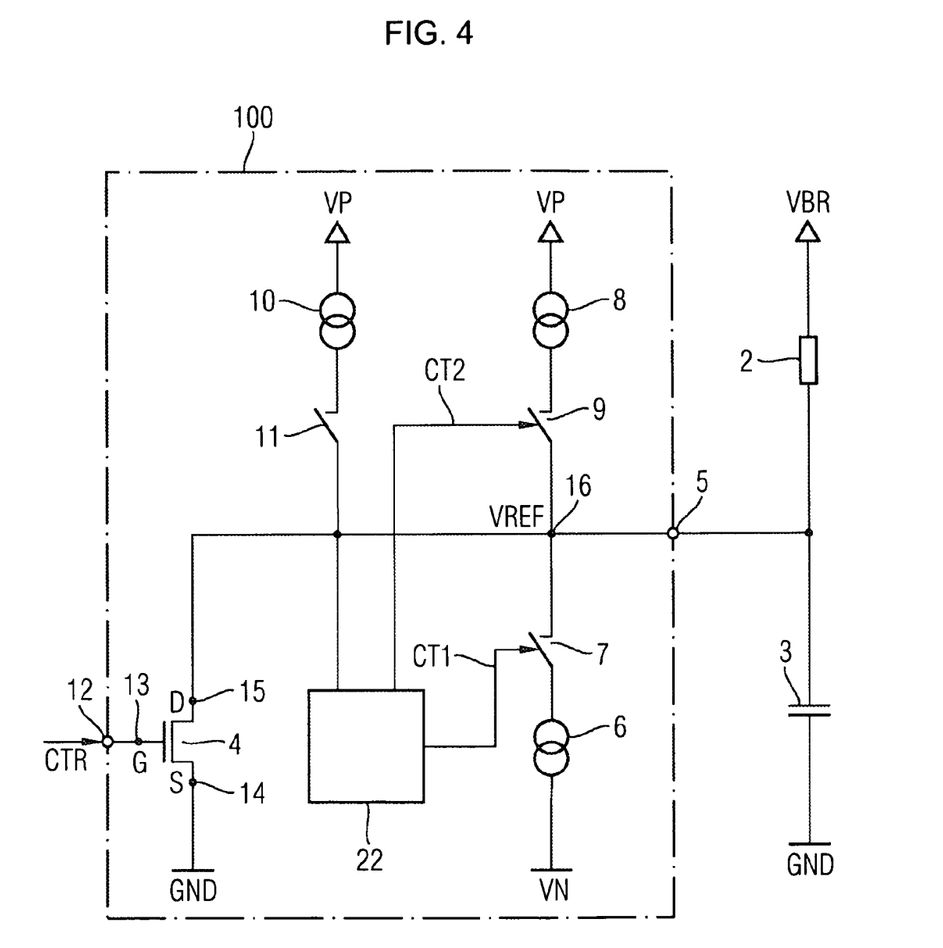
FIG. 4 shows a second embodiment of the circuit arrangement according to the present invention.

In principle, the variant described above of the method according to the present invention for detecting the state of the load device can also be applied to a low-side switch. FIG. 4 is a schematic representation of a corresponding low-side switch 100. The low-side switch with diagnosis function 100 exhibits a control input 12 and a switching connection 5. A load device 2 is connected between the switching connection 5 and the battery potential VBR. Furthermore, an EMC buffer capacitor 3 is connected between the switching connection 5 and the earth potential GND.

A MOSFET transistor with a control terminal 13, a source terminal 14 and a drain terminal 15 is provided as a controllable switch 4, whereby the source terminal 14 is connected to earth GND and the drain terminal 15 is connected to the switching connection 5. By coupling a control signal CTR via the control input 12 to the gate terminal 13, the transistor 4 can be opened or closed, resulting in the switching connection 5 being coupled to or decoupled from the earth potential.

A first and a second current source 6, 8 are connected in series by means of two switches 7, 9 that are controlled by a control device 22 between the first adjustment potential VN and a second adjustment potential VP. A controlled reference potential VREF can therefore be tapped at a node 16 between the two current sources 6, 8. Furthermore, an additional current source 10 can be connected between the switching connection 5 and the second adjustment potential VP, which is 5 volts for example, by means of an additional switch 11.

In order to diagnose whether the load device 2 is actually connected to the switching connection 5, the switching connection 5 can for example be regularly, i.e. periodically with a predetermined filter time T, decoupled from the earth connection GND by switching the transistor 4. Because appropriate high-side or low-side switches are frequently actuated by pulse-width-modulated signals, the reduction of the filter time T according to the present invention is particularly favorable, as smaller pulse widths and therefore quicker actuation signal sequences CTR can be implemented in this way and yet it is still possible to diagnose the load state.

Figure 5:
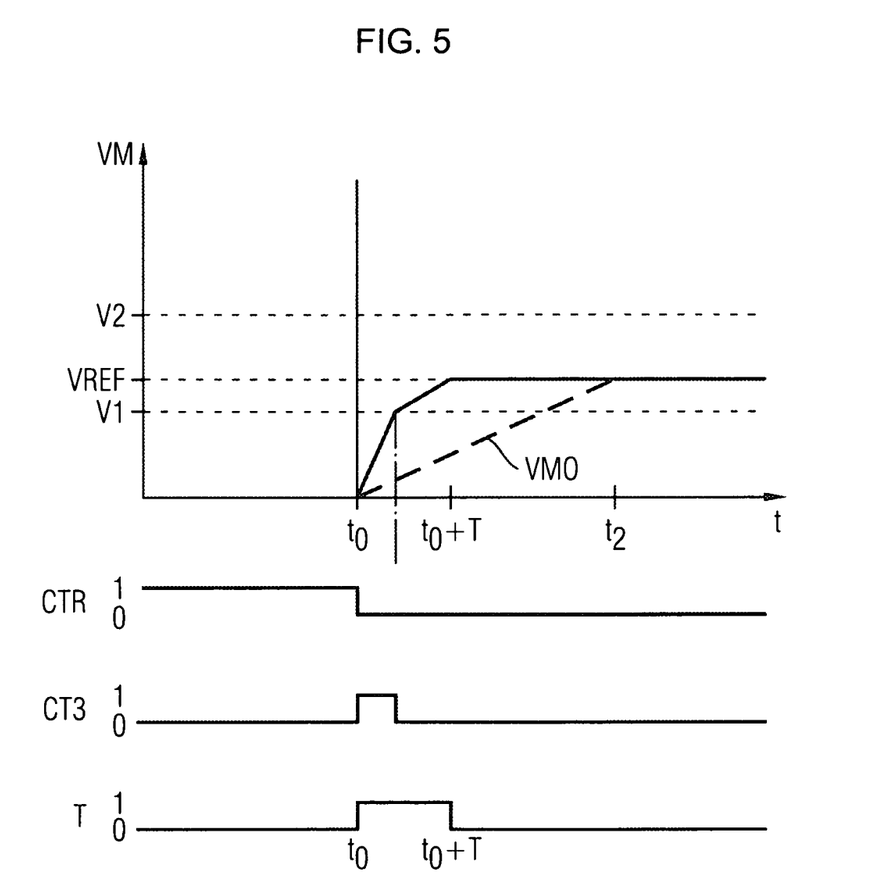
FIG. 5 shows voltage curves for the second embodiment of the circuit arrangement.

FIG. 5 shows a corresponding voltage curve for a measurement potential that can be tapped at switching connection 5 and the sequence over time of the connection of the additional current source and the filter time T. As described in reference to FIGS. 1 and 3, the switch 4 is opened by the control signal CTR at the point in time $t_0$, i.e. the controllable channel between the source and the drain terminals 14, 15 of the transistor 4 becomes highly resistive. If the load device 2 has been removed, the reference potential VREF of 2.5 volts would have to occur at the node 16 and the connected switching connection 5 when the two current sources 6, 8 are connected by means of switches 7, 9. If only these two current sources 6, 8 are active, the dashed line labeled VMO occurs for the measurement potential, i.e. the capacitor was charged by the current source 8 at a later point in time $t_2$, causing VREF to occur at switching connection 5.

However, according to the present invention, there is an additional current source 10 that is connected to the switching connection 5 by means of the switch 11 at the same time as the decoupling of GND. This results in the solid line for the progression of the measurement potential VM. The diagnosis potential V1<VREF occurs at the switching connection 5 at a considerably earlier point in time $t_1$, because the additional current source 10 charges the capacitor 3 more quickly. The filter time period T can therefore be significantly reduced.

The first and second current sources 6, 8 can be dimensioned at around 0.1 mA, whereby the temporarily connected additional current source 10 can be configured as a 2 mA current source. If the capacitor 3 has a capacitance of 6.8 nF, this results in diagnosis or switching frequencies of around 5 kHz.

Accordingly, an open-load situation can be inferred if the measurement potential is within a range between V1 and V2. Suitable values for this are for example V1=2 V and V2=3 V. If a voltage occurs in this range between V1 and V2 during the filter time period T following the decoupling of the switching connection 5 from the earth potential GND, an open-load state is detected. By contrast, if there is a short circuit of the switching connection 5 to earth GND following the decoupling, the measurement potential is considerably less than V1, and specifically practically at earth potential GND. If the load device 2 remains correctly connected to the switching connection 5 without fault, a measurement potential VM flowing towards VBR occurs at the switching connection 5.

Figure 6:
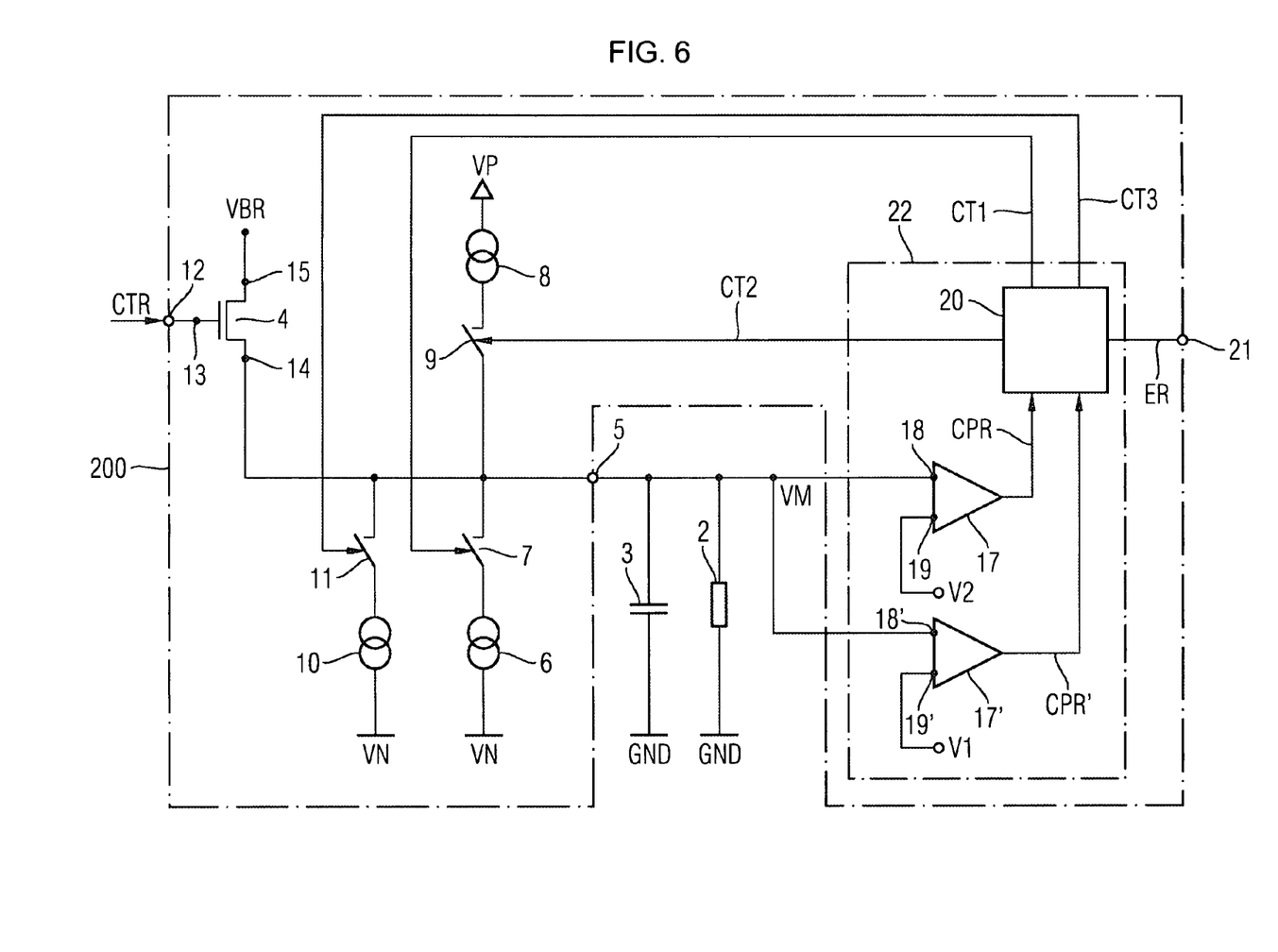
FIG. 6 shows a third embodiment of the circuit arrangement according to the present invention.

FIG. 6 shows a third embodiment of the circuit arrangement according to the present invention. The circuit arrangement 200 configured as a high-side switch essentially exhibits the same elements as the circuit arrangement 1 shown in FIG. 1.

Furthermore, there is a control device 22 that comprises a comparator 17 and a controller 20. The comparator 17 has a first input 18 and a second input 19, whereby the second input 19 is connected to the reference potential VREF. The first input 18 of the comparator 17 is connected to the switching connection 5. The comparator 17 supplies a comparison result CPR to the controller 20, which supplies control signals CT1, CT2, CT3 to the controllably configured switches 7, 9, 11 in order to connect the first and second current sources 6 and 8 and the additional current source 10. The comparator 17 can for example issue a comparison result CPR that the measurement potential VM is greater than, smaller than or equal to the diagnosis potential V2.

The controller 20 of the control device 16 evaluates this result CPR and supplies a fault signal ER to a fault output 21 of the circuit arrangement 200. The control device 16 is configured such that a method according to the present invention for detecting the state of the load device 2 is executed, as has been explained with reference to FIGS. 1-3 for example.

An arrangement of the control device 22 with two comparators is also conceivable, which compare the measurement potential with a lower and an upper diagnosis potential V1, V2. It can then be determined whether a measurement potential VM at the switching connection 5 is within the open-load-potential range V2-V1. FIG. 6 shows a corresponding optional comparator 17' with a first and a second input 18', 19', which supplies a second comparison result CPR' to the control device 20. The second input 18' is connected to the lower diagnosis potential V1 and the first input 18' to the switching connection 5.

The circuit arrangement according to the present invention is particularly suitable for integrating on a semiconductor chip for use in the automotive field, where power switches are often used as high-side or low-side switches. The connection of the additional current source according to the present invention results in an improved diagnostic capability for detecting open-load states of the designated load device for example.

Although the present invention has been described with reference to preferred embodiments, it is not restricted thereto, but rather can be modified in a variety of ways. The current and voltage levels stated are to be understood as examples only. Furthermore, it is conceivable that several appropriate high-side or low-side switches can be configured in an integrated semiconductor device, whereby each fault output issues the state or status of the relevant connected load. In addition, the invention can be easily implemented, as an additional or temporarily connected current source does not require any appreciable increase in circuit complexity.

The invention claimed is:

1. A method for detecting a state of a load device that can be connected to a switching connection in a circuit configuration, wherein the switching connection can be coupled to and decoupled from a predefined switching potential, the method which comprises:

using a voltage drop across the switching connection as a basis for determining whether the load device is connected to the switching connection, the load device is not connected to the switching connection, or there exists a short circuit between the switching connection and a ground potential or a non-zero supply potential; and connecting an additional current source to the switching connection at the same time as the switching connection is decoupled from the predefined switching potential;

selecting the circuit configuration from the group consisting of a first circuit configuration and a second circuit configuration, wherein:

in the first circuit configuration, the load device is connected between the switching connection and the ground potential, a controllable switch is connected between the switching connection and the non-zero supply potential, and the additional current source is connected between the switching connection and the ground potential; and in the second circuit configuration, the load device is connected between the non-zero supply potential and the switching connection, a controllable switch is connected between the switching connection and the ground potential, and the additional current source is connected between a positive potential, which is different from the non-zero supply potential, and the switching connection.

2. The method according to claim 1, which further comprises the step of: determining the voltage drop by way of a capacitor connected between the switching connection and the ground potential.

3. The method according to claim 1, wherein the connecting step further comprises the step of: connecting the additional current source to the switching connection for a predetermined filter time period.

4. The method according to claim 1, which further comprises the step of: removing the additional current source from the switching connection if a measurement potential measured at the switching connection corresponds to a diagnosis potential.

5. The method according to claim 1, which further comprises the steps of:
a) decoupling the load device from the switching connection;
b) applying a reference potential across the switching connection; and
c) connecting the additional current source between an adjustment potential and the switching connection until a measurement potential at the switching connection corresponds to a diagnosis potential or until a predetermined filter time has expired.

6. The method according to claim 5, which comprises executing the further process steps:
d) measuring the measurement potential present at the switching connection; and
e) comparing the measurement potential with the diagnosis potential.

7. The method according to claim 1, wherein:
the load device is connected between the switching connection and the ground potential forming the predetermined switching potential, and the switching connection can be coupled to a battery potential by way of a controllable switch, and wherein:

following the decoupling of the load device from the battery potential, determining that the load device is not connected to the switching connection and/or to the ground potential if a measurement potential lies within a predefined open-load-potential range within the filter time period.

8. The method according to claim 1, wherein:
the load device is connected between the switching connection and a battery potential forming the predetermined switching potential, and the switching connection can be coupled to the ground potential by way of a controllable switch, and wherein:

following the decoupling of the load device from the ground potential, determining that the load device is not connected to the switching connection and/or to the battery potential if a measurement potential lies within a predefined open-load-potential range within the filter time period.

9. The method according to claim 2, which further comprises the step of: selecting the predefined filter time period such that, owing to the charging or discharging of the capacitor, the switching connection is brought to the reference potential within the filter time period by way of the applied reference potential and the additional current source.

10. A circuit arrangement for detecting a state of a load device that is connected between a switching connection and a first switching potential being a ground potential, comprising:
a) a controllable switch connected between the switching connection and a second switching potential being a non-zero supply potential;
b) a first current source connected between a first adjustment potential and the switching connection, and a second current source connected between the switching connection and a second adjustment potential, wherein a reference potential is present at the switching connection between said first current source and said second current source; and
c) an additional current source connected between the ground potential and the switching connection.

11. The circuit arrangement according to claim 10, which further comprises a capacitor connected between the switching connection and the first switching potential.

12. The circuit arrangement according to claim 10, wherein said controllable switch is a MOSFET.

13. The circuit arrangement according to claim 12, wherein said controllable switch is a p-channel MOSFET or an n-channel MOSFET.

14. The circuit arrangement according to claim 10, wherein at least one of said first and second current sources, and said additional current source are connectible, controllable current sources.

15. The circuit arrangement according to claim 10, which further comprises a control device connected to the switching connection and configured to carry out the method according to claim 1.

16. The circuit arrangement according to claim 15, wherein said control device includes at least one comparator for comparing a measurement potential with a diagnosis potential.

17. The circuit arrangement according to claim 10, configured as an integrated high-side switch or low-side switch, wherein said controllable switch, said first current source, said second current source, said additional current source, and a control device are commonly integrated on a chip.

* * * * *